United States Patent
Ferdinandi et al.

(10) Patent No.: US 8,492,898 B2
(45) Date of Patent: Jul. 23, 2013

(54) PRINTED CIRCUIT BOARDS

(75) Inventors: Frank Ferdinandi, Cambridge (GB); Rodney Edward Smith, Essex (GB); Mark Robson Humphries, Essex (GB)

(73) Assignee: Semblant Global Limited, London (GB)

( * ) Notice: Subject to any disclaimer, the term of this patent is extended or adjusted under 35 U.S.C. 154(b) by 725 days.

(21) Appl. No.: 12/526,586

(22) PCT Filed: Feb. 18, 2008

(86) PCT No.: PCT/GB2008/000552
§ 371 (c)(1),
(2), (4) Date: Aug. 10, 2009

(87) PCT Pub. No.: WO2008/102113
PCT Pub. Date: Aug. 28, 2008

(65) Prior Publication Data
US 2010/0025091 A1    Feb. 4, 2010

(30) Foreign Application Priority Data
Feb. 19, 2007   (GB) .................................. 0703172.7

(51) Int. Cl.
*H01L 23/48* (2006.01)
*H05K 1/00* (2006.01)

(52) U.S. Cl.
USPC ........... 257/753; 257/779; 257/783; 257/784; 361/760; 361/767; 361/771; 174/259; 228/180.5

(58) Field of Classification Search
USPC .......... 174/256, 260–261, 258, 259; 257/753, 257/779, 783, 784, 785; 361/760, 767, 771; 228/180.5
See application file for complete search history.

(56) References Cited

U.S. PATENT DOCUMENTS

| | | |
|---|---|---|
| 3,649,475 A | 3/1972 | Degnan et al. |
| 3,770,571 A | 11/1973 | Alsberg et al. |
| 4,136,225 A | 1/1979 | Feit et al. |
| 4,311,749 A | 1/1982 | Hiraiwa et al. |
| 4,369,287 A | 1/1983 | Hutchinson et al. |
| 4,508,756 A | 4/1985 | Senda et al. |
| 4,547,424 A | 10/1985 | Suzuki |
| 4,591,659 A | 5/1986 | Leibowitz |
| 4,640,866 A | 2/1987 | Suzuki |
| 4,689,110 A | 8/1987 | Leibowitz |
| 4,710,429 A | 12/1987 | Bogan et al. |
| 4,755,911 A | 7/1988 | Suzuki |
| 4,772,509 A | 9/1988 | Komada et al. |
| 4,784,901 A | 11/1988 | Hatakeyama et al. |
| 4,784,945 A | 11/1988 | Tawara et al. |
| 4,800,243 A | 1/1989 | Osawa et al. |
| 4,895,756 A | 1/1990 | Suzuki |
| 4,911,771 A | 3/1990 | Tanaka et al. |
| 4,975,319 A | 12/1990 | Walles et al. |
| 5,043,221 A | 8/1991 | Koleske |
| 5,141,702 A | 8/1992 | Guenin et al. |
| 5,274,913 A * | 1/1994 | Grebe et al. ...................... 29/840 |
| 5,294,519 A | 3/1994 | Mori et al. |
| 5,352,762 A | 10/1994 | Nagai et al. |
| 5,639,555 A | 6/1997 | Bishop |
| 5,734,008 A | 3/1998 | Shirasaki et al. |
| 5,858,074 A | 1/1999 | Cole et al. |
| 5,955,179 A | 9/1999 | Kickelhain et al. |
| 6,238,774 B1 * | 5/2001 | Park et al. ...................... 505/230 |
| 6,284,308 B2 * | 9/2001 | Seki et al. ..................... 427/97.2 |
| 6,365,841 B1 | 4/2002 | Takigami |
| 6,540,866 B1 | 4/2003 | Zhang et al. |
| 6,589,639 B2 * | 7/2003 | Farquhar et al. .............. 428/209 |
| 6,740,816 B2 * | 5/2004 | Treutlein et al. ........... 174/117 F |
| 6,785,389 B1 | 8/2004 | Sella et al. |
| 6,803,092 B2 * | 10/2004 | Pocius et al. .................. 428/209 |
| 6,852,931 B2 | 2/2005 | Hedler et al. |
| 6,861,092 B2 * | 3/2005 | McCarthy et al. .......... 427/207.1 |
| 6,924,008 B2 * | 8/2005 | Takai et al. .................... 428/1.1 |
| 6,941,978 B2 * | 9/2005 | Riffle .............................. 141/7 |
| 7,045,198 B2 | 5/2006 | Nakagiri et al. |
| 7,176,402 B2 * | 2/2007 | Okumura et al. ........ 219/121.41 |
| 7,195,857 B2 | 3/2007 | Tamura et al. |
| 7,340,826 B2 | 3/2008 | Hedler et al. |
| 7,396,591 B2 * | 7/2008 | Miyashita et al. ............ 428/458 |
| 7,396,596 B2 * | 7/2008 | Wessling ..................... 428/674 |
| 7,527,915 B2 * | 5/2009 | Mutoh ........................ 430/273.1 |
| 7,579,134 B2 * | 8/2009 | Dueber et al. ............. 430/283.1 |
| 7,635,016 B2 * | 12/2009 | Suzuki et al. ................. 156/535 |

(Continued)

FOREIGN PATENT DOCUMENTS

| | | |
|---|---|---|
| DE | 42 39 324 A1 | 11/1992 |
| DE | 4437573 A1 | 6/1995 |

(Continued)

OTHER PUBLICATIONS

PCT Notification of Transmittal of the Intl. Search Report and the Written Opinion of the Intl. Searching Authority, or the Declaration, re PCT/GB2008/000552 mailed Oct. 23, 2008.
Communication from IPO, Patents Directorate, South Wales, Nov. 28, 2008 re GB 0815095.5.
Communication from IPO, Patents Directorate, South Wales, Dec. 3, 2008 re GB 0815094.8.
Communication from IPO, Patents Directorate, South Wales, Apr. 1, 2009 re GB 0815096.3.
Communication from IPO, Patents Directorate, South Wales, Sep. 1, 2009 re GB 0815096.3 Cl. 9.
Communication from IPO, Patents Directorate, South Wales, Sep. 1, 2009 re GB 0815096.3 Cl. 16.
Communication from IPO, Patents Directorate, South Wales, Sep. 10, 2009 re GB 0815096.3 Cl. 14.

(Continued)

*Primary Examiner* — Cathy Lam
(74) *Attorney, Agent, or Firm* — Baker Botts L.L.P.

(57) ABSTRACT

A printed circuit board to which a localised solder connection is to be made, the surface of said printed circuit board having a continuous or non-continuous coating of a composition comprising a halo-hydrocarbon polymer at a thickness of from 1 nm to 10 μm.

35 Claims, 8 Drawing Sheets

U.S. PATENT DOCUMENTS

| | | | |
|---|---|---|---|
| 7,673,970 B2 * | 3/2010 | Bertelsen et al. | 347/50 |
| 7,985,677 B2 * | 7/2011 | Fujii et al. | 438/638 |
| 8,008,588 B2 * | 8/2011 | Kaida et al. | 200/285 |
| 2003/0222379 A1 | 12/2003 | Baik et al. | |
| 2004/0026775 A1 | 2/2004 | Hecht et al. | |
| 2005/0121226 A1 | 6/2005 | McKee et al. | |

FOREIGN PATENT DOCUMENTS

| | | |
|---|---|---|
| EP | 0 298 204 A2 | 5/1987 |
| EP | 0 355 955 A3 | 6/1989 |
| EP | 0 393 832 A1 | 3/1990 |
| EP | 0 449 292 A2 | 3/1991 |
| EP | 0 498 258 B1 | 1/1992 |
| EP | 0 710 690 A2 | 10/1995 |
| GB | 1 287 519 | 6/1970 |
| GB | 1 484 538 | 2/1974 |
| GB | 2 285 340 A | 7/1995 |
| GB | 2 453 083 A | 3/2009 |
| JP | 60258232 A | 12/1985 |
| JP | 2120351 A | 10/1988 |
| JP | 1131270 A | 5/1989 |
| JP | 2086675 A | 3/1990 |
| JP | 2167329 A | 6/1990 |
| JP | 3129796 A | 6/1991 |
| JP | 3242992 A | 10/1991 |
| JP | 3278494 A | 12/1991 |
| JP | 4208597 A | 7/1992 |
| JP | 8027453 A | 7/1994 |
| JP | 8143846 A | 11/1994 |
| JP | 7173251 A | 7/1995 |
| JP | 7201502 A | 8/1995 |
| JP | 7323501 A | 12/1995 |
| JP | 11305430 A | 11/1999 |
| JP | 11319635 A | 11/1999 |
| JP | 2000211057 A | 8/2000 |
| JP | 2003201571 A | 1/2002 |
| JP | 2002329741 A | 11/2002 |
| JP | 2003342311 A | 12/2003 |
| JP | 2005112981 A | 4/2005 |
| JP | 2005161778 A | 6/2005 |
| JP | 2005169538 A | 6/2005 |
| JP | 2007010794 A | 6/2005 |
| JP | 2007123370 A | 10/2005 |
| JP | 2006063315 A | 3/2006 |
| JP | 2007084764 A | 4/2007 |
| JP | 2007123712 A | 5/2007 |
| JP | 2007129039 A | 5/2007 |
| JP | 2007326956 A | 12/2007 |
| JP | 2008294391 A | 12/2008 |
| KR | 2005 645641 | 5/2005 |
| WO | WO 97/11134 | 3/1997 |
| WO | WO 97/39610 | 10/1997 |
| WO | WO 98/58117 | 12/1998 |
| WO | WO 00/20130 | 4/2000 |
| WO | WO 03/002675 | 1/2003 |
| WO | WO 03/087224 A1 | 10/2003 |
| WO | WO 2004/027115 A1 | 4/2004 |
| WO | WO 2005/121101 | 12/2005 |
| WO | WO 2008/102113 | 8/2008 |
| WO | WO 2009/026284 A2 | 2/2009 |
| WO | WO 2009/058732 A1 | 5/2009 |

OTHER PUBLICATIONS

Communication from IPO, Patents Directorate, South Wales, Sep. 11, 2009 re GB 0815096.3 Cl. 11-13.

Cabrera et al., *J. Vac. Sci. Technol.* A8(6), Nov./Dec. 1990, *Surface Analysis of Copper, Brass, and Steel Foils Exposed to Fluorine Containing Atmosphere*, 1990.

Deltschew et al., *Surface and Coating Technology* 142,-144 (2001) 803-807, *Plasma Treatment Process for Fluxless Reflow Soldering*, 2001.

Stetter et al., *Journal of the Electrochemical Society*, 150(2) S11-S16 (2003), *Sensors, Chemical Sensors, Electrochemical Sensors, and ECS*, 2003.

Wolter et al., *Electronic Components and Technology Conference*, 2001, 1295-1298, *Plasma Treatment Process for Fluxless Reflow Soldering*, 2001.

\* cited by examiner

PRINTED CIRCUIT BOARDS

RELATED APPLICATIONS

The present application is a U.S. National Stage Application of International Application No. PCT/GB2008/000552, filed Feb. 18, 2008, entitled "Printed Circuit Boards," which claims priority to United Kingdom Application No. GB 0703172.7, filed Feb. 19, 2007, entitled "Printed Circuit Boards.

TECHNICAL FIELD

The present invention relates to articles such as those comprising printed circuit boards coated with a halo-hydrocarbon polymer.

DETAILED DESCRIPTION

Printed circuit boards (PCBs) are used in the electronics industry to mechanically support and electrically connect electrical and electronic components. A PCB comprises a board or other substrate made of an insulating material on which conductive tracks, typically made of copper, lie. These conductive tracks function as wires between electrical components that are later attached to the board by, for example, soldering. A large proportion of PCBs are manufactured by depositing or otherwise adhering a layer of copper to the substrate board, and then removing unwanted copper by chemical etching to leave copper tracks in the required configuration. At this stage the blank PCBs may often be stored for variable periods of time, potentially up to several months, prior to attachment of the electronic components to the PCB by a soldering method.

The conductive tracks on the printed circuit board may be made from any conductive material. The preferred material for the tracks is copper. Copper is the preferred material for the conductive tracks mainly due to its high electrical conductivity, but unfortunately copper is readily oxidised in air leading to a layer of copper oxide, or tarnish, on the surface of the metal. This oxidation is particularly evident if a long period of time has elapsed between manufacture of the blank PCB and attachment of the electrical components. The components are attached by soldering, but the presence of an oxide layer on the copper tracks may reduce the effectiveness of soldering. In particular dry joints, which have a tendency to fail during operation of the device, and weak joints with low mechanical strength may be formed. Occasionally the joint will fail to make electrical contact altogether. Similar problems arise when the conductive tracks comprise conductive materials other than copper.

To minimise these problems, PCB manufacturers apply a range of coatings, or surface finishes, to the areas where soldering will be required. Metals such as tin, silver or a nickel/gold combination are frequently used. The processes for applying these finishes are all time consuming, requiring additional metals to be used, with consequent environmental issues. There are potential health issues associated with some of the processes and materials. Further, some of the metals used, such as gold, are expensive. A similar approach involves coating the tracks with a coating comprising organic compounds such as benzimidazoles and particles of solder-wettable metals or solder (see for example WO 97/39610), thus preventing exposure of the tracks to oxidative conditions. During soldering the organic layer is simply removed. These organic coatings typically do not survive multiple heat cycles and have a relatively short storage life before processing.

It is apparent that the techniques adopted by manufacturers up until now are either expensive or time consuming (involving extra steps in the manufacturing process), or both, and deplete non-renewable resources including precious metals. There is a need for a cheaper and/or higher performance method of preventing oxidation of the conductive tracks prior to attachment of electrical components by soldering.

A separate issue is that PCBs are often required in devices that are used in very harsh and corrosive environments. Under such conditions, the conductive tracks on the PCB may be corroded leading to a far shorter lifetime of the circuit board than would normally be expected. Such conditions may arise, for example, when a device is used in very humid environments, especially where microscopic droplets of water containing dissolved gases such as sulphur dioxide, hydrogen sulphide, nitrogen dioxide, hydrogen chloride, chlorine and water vapour form a corrosive solution. Additionally, droplets of moisture may form a thin film or corrosion deposits between conductive tracks on the PCB that may potentially cause short circuits. In circumstances where PCB manufacturers envisage the devices being used in hostile conditions, they have tended to coat the assembled PCB with a conformal coating of a polymer that forms a barrier to the environment. However such coatings are expensive to apply and require an extra step in the manufacturing process to apply the coating after the PCB has been assembled, and generally an extra step later to remove it. This may also cause problems when reworking a damaged or failed PCB, or during testing to ascertain its performance and troubleshoot a problem. A cheaper and/or high performance method of environmentally protecting the completed PCB would be of great interest to manufacturers.

Another problem that may arise after soldering electronic components to a PCB is the formation of dendrites of metal compounds on the solder joint. These dendrites can cause failure of the assembled PCB due to short circuits between contacts. Dendrites are very fine metallic growths along a surface, resulting from electromigration, which form fern-like patterns. The growth mechanism for dendrites is well understood, unlike "tin whiskers", and requires the presence of moisture that generates metal ions that are then redistributed by electromigration in the presence of an electromagnetic field. The coating of the invention protects against the formation of dendrites by preventing moisture reaching the surface of the PCB, which is where dendrites normally grow. The coating provides additional protection as dendrite materials have low adhesion to the surface coating reducing the formation of dendrites between contacts and components.

The present invention provides a printed circuit board to which a generally localised solder connection is to be made, the surface of said printed circuit board having a coating of a composition comprising one or more halo-hydrocarbon polymers, in single or multiple layers, at a thickness of from that of a monolayer (usually a few angstroms (Å)) to 10 µm, wherein there is no solder, or essentially no solder, between said coating composition and the conductive tracks of said printed circuit board. By polymer we include polymers formed in-situ from single or multiple monomers, linear, branched, grafted and crosslinked copolymers, oligomers, multipolymers, multimonomer polymers, polymer mixtures, grafted copolymers, blends and alloys of polymers, as well as interpenetrating networks of polymers (IPNs).

The thickness of the coating is typically from 1 nm to 2 µm, more typically from 1 nm to 500 nm, still more typically from 3 nm to 500 nm, still more typically from 10 nm to 500 nm, and most typically from 10 nm to 250 nm. The coating is preferably at a thickness of from 10 nm to 100 nm, in various gradients, with 100 nm being a preferred thickness. In another embodiment, the thickness of the coating is 10 nm to 30 nm. However, the optimal thickness of the coating will depend on the properties that are required of the PCB. For example, if very high environmental toughness is required (high corrosion and abrasion resistance), a thicker coating may be used. Additionally the coating thickness may be optimised with different thicknesses at different locations across the PCB dependent on which feature is being optimised (for example, environmental protection versus Z axis conductivity). The coating thickness and flux composition can be varied to optimise environmental protection characteristics and give particularly strong solder joints.

The halo-hydrocarbon coating may be continuous, substantially continuous (particularly over surfaces to be soldered and non-soldering surfaces between or adjacent to them, and more particularly over substantially all exposed and vulnerable surfaces of the PCB), or non-continuous. For a very high level of environmental protection, a substantially continuous coating may be required. However, a non-continuous coating may be sufficient for other purposes.

By halo-hydrocarbon polymer it is meant a polymer with a straight or branched chain or ring carbon structure with 0, 1, 2 or 3 halogen atoms bound to each carbon atom in the structure. The halogen atoms could be the same halogens (for example fluorine) or a mixture of halogens (for example fluorine and chlorine). The term "halo-hydrocarbon polymer" as used herein includes polymers that contain one or more unsaturated groups, such as carbon-carbon double and triple bonds, and polymer that contain one or more heteroatoms (atoms which are not C, H or halogen), for example N, S or O. Currently we prefer, however, that the polymer contains substantially no unsaturation (because unsaturation often results in reduced stability) and substantially no such heteroatoms. Preferably the polymer contains less than 5% heteroatoms as a proportion of the total number of atoms in the polymer. Preferably the polymer contains less than 5% carbon-carbon double or triple bonds as a proportion of the total number of carbon-carbon bonds. The molecular weight of the polymer is preferably greater than 1000 amu.

The polymer chains may be straight or branched, and there may be crosslinking between polymer chains. The halogen may be fluorine, chlorine, bromine or iodine. Preferably the polymer is a fluoro-hydrocarbon polymer, a chloro-hydrocarbon polymer or a fluoro-chloro-hydrocarbon polymer wherein 0, 1, 2 or 3 fluoro or chloro atoms are bonded to each carbon atom in the chain.

Examples of preferred polymers include:
PTFE, PTFE type material, fluorinated-hydrocarbons, chlorinated-fluorinated-hydrocarbons, halogenated-hydrocarbons, halo-hydrocarbons or co-polymers, oligomers, multipolymers, multimonomer polymers, polymer mixtures, blends, alloys, branched chain, grafted copolymers, cross-linked variants of these materials and also interpenetrating polymer networks (IPNs).
PCTFE (polychlorotrifluoroethylene) and copolymers, oligomers, multipolymers, multimonomer polymers, polymer mixtures, blends, alloys, branched chain, grafted copolymers, cross-linked variants of this material and also interpenetrating polymer networks (IPNs).
EPCTFE (ethylene copolymer of polychlorotrifluoroethylene) and copolymers, oligomers, multipolymers, multimonomer polymers, polymer mixtures, blends, alloys, branched chain, grafted copolymers, cross-linked variants of this material and also interpenetrating polymer networks (IPNs).
Other fluoroplastics including the materials below and co-polymers, oligomers, multipolymers, multimonomer polymers, polymer mixtures, blends, alloys, branched chain, grafted copolymers, cross-linked variants of these materials as well as interpenetrating polymer networks (IPNs): ETFE (copolymer of ethylene and tetrafluoroethylene), FEP (copolymer of tetrafluoroethylene and hexafluoropropylene), PFA (copolymer of tetrafluoroethylene and perfluorovinyl ether), PVDF (polymer of vinylidenefluoride), THV (copolymer of tetrafluoroethylene, hexafluoropropylene and vinylidenefluoride), PVDFHFP (copolymer of vinylidene fluoride and hexafluoropropylene), MFA (copolymer of tetrafluoroethylene and perfluoromethylvinylether), EFEP (copolymer of ethylene, tetrafluoroethylene and hexafluoropropylene), HTE (copolymer of hexfluoropropylene, tetrafluoroethylene and ethylene) or copolymer of vinylidene fluoride and chlorotrifluoroethylene and other fluoroplastics.

Most preferably the polymer is a polytetrafluoroethylene (PTFE) type material, and in particular polytetrafluoroethylene (PTFE).

A lower wettability may be achieved by using a coating in which the halo-hydrocarbon is a highly branched polymer a copolymer, polymer blend or a polymer mixture.

It is desirable that the coating composition have any one or more, and preferably substantially all, of the following properties: capable of being deposited as continuous films, free of cracks, holes or defects; relatively low gaseous permeability which provides a significant barrier to gaseous permeation and avoids gaseous corrosion and oxidation 'through' the coating; the ability to selectively solder through without the need for prior removal and to achieve good solder joints comparable to other currently available surface finishes; the ability to withstand multiple heat cycles; chemical resistance to corrosive gases, liquids and salt solutions, particularly environmental pollutants; exhibit low surface energy and 'wettability'; to be stable inert material at normal PCB temperatures; have good mechanical properties, including good adhesion to PCB materials and good mechanical abrasion resistance; improved electrostatic protection; relatively low liquid and salt solution permeability, to avoid liquid corrosion 'through' the coating; and generally be environmentally beneficial compared to existing processes when used in this application.

The invention can also provide other electrical and/or electronic devices, or other articles (such as pipes or other plumbing apparatus) to which solder connections are to be made, having such a coating. For example, the invention could be used to coat the bare wires (especially copper wires) used in wire bonding techniques. Wire bonding is a method of making interconnections between an integrated circuit in bare die form and the leadframe inside the integrated circuit or between the bare die and a PCB. The wire used has traditionally been gold or aluminum but more recently there has been a considerable interest in using copper wire for a number of reasons including the significant cost differential with gold. In wire bonding, two jointing methods are commonly used, wedge bonding and ball bonding, both of which use different combinations of heat, pressure, and ultrasonic energy to make a weld at either or both ends of the wire. To achieve a good bond both the wire and the pad to which it is bonded must be free of contaminants including oxidation. It is standard practice to apply a gold finish to the bond pad to prevent oxidation. The coating of the present invention on a copper bond pad will also provide an oxidation free surface, allowing wire bonding joints to be made using gold, aluminum or copper wire, either by wedge bonding or ball bonding but at a significantly lower cost than the standard gold finish on the bond pad. Where copper wire is being used it is also beneficial to apply the halo-hydrocarbon coating to the wire to prevent oxidation after the wire has been made and prior to storage. Also, the halo-hydrocarbon coating provides additional oxidation protection during the bonding process. Alternatively, in another embodiment of the invention, the electrodes of electronic components could be coated. The polymer coating preferably provides a good barrier to the permeation of atmospheric gases and liquids, most importantly oxygen, which would normally react with the conductive tracks, typically copper tracks, to form a layer of tarnish, typically copper oxide, on the surface of the track. As a result, the coated circuit board may be stored for long periods of time, up to several months or years, without damaging oxidation of the conductive tracks occurring. Optical microscopy, scanning electron microscopy and back scattering electron imaging have been used to investigate the nature, continuity and thickness of the coating. Energy dispersive analysis by X-rays has been used to map the levels and distribution of halogens in the coating. Measurements of the surface activation and surface wettability using chemical solvent solutions provide an indication of the potential to act as a protective coating.

Once the manufacturer is ready to install components on the blank PCB, there is no requirement to clean the PCB or to remove the coating layer prior to the soldering process. This arises because, surprisingly, the halo-hydrocarbon polymer used provides a coating that has the unusual property that it may be soldered through to form a solder joint between the conductive track on the board and the electrical component. Flux is generally required in this soldering technique. In the extreme, a soldering process using heat alone could be used to selectively "remove" the coating, for example laser soldering. Welding, laser-enhanced welding, ulstrasonic welding or use of conductive adhesives are further alternatives. Another possible technique is wave soldering; this technique may require selective fluxing. The solder used may be leaded solder or lead-free solder. There is generally no reduction in the strength of the solder joint as might be expected, and indeed under certain circumstances the solder joint may be stronger than a standard solder joint. Furthermore, under certain circumstances, the present invention may prevent dendrite formation on the solder bonds, particularly when lead-free solder is used.

Thus, the present invention provides an alternative technique to applying surface coatings of metals (such as tin, silver, nickel and gold) to the conductive tracks of PCBs to prevent oxidation of the conductive tracks prior to soldering. The present invention has the advantage that it is based on a low cost process, it does not use toxic metals such as nickel, it is environmentally friendly and it is safer than current industrial metal plating processes. It also simplifies the PCB manufacturing process and is compatible with current industrial soldering processes. In addition it has the extra benefit of "solder through" properties, whereby the need to remove the coating before soldering is avoided.

A further feature of the halo-hydrocarbon polymer coating is that it is only removed in the areas where solder and/or flux is applied. Thus, in the areas of the PCB where components are not attached by selective soldering the coating remains intact, maintaining a protective layer over the board and conductive tracks, which provides a barrier to corrosion by atmospheric gases such as sulphur dioxide, hydrogen sulphide, nitrogen dioxide, hydrogen chloride, chlorine and water vapour and other corrosive materials, thus avoiding corrosion by environmental pollutants. The halo-hydrocarbon polymer coating is also substantially impermeable to liquids and corrosive liquids. Consequently it is possible to attach components to the circuit board in a series of steps with significant periods of time elapsing between each step; this could provide a number of advantages to the manufacturer. This coating is not destroyed by the soldering process other than in the selected solder areas, therefore in the non-soldered areas the PCB can be reprocessed and/or reworked by soldering at a later stage. Furthermore, once assembly of the PCB is completed, the unsoldered areas of the PCB remain coated with the halo-hydrocarbon polymer that forms a permanent barrier to environmental corrosion. There is no need for further costly over-coating steps such as conformal coating.

The conductive tracks on the printed circuit board may comprise any conductive material. Possible materials from which the conductive tracks may be made are metals such as copper, silver, aluminium or tin, or conductive polymers or conductive inks. The preferred material for the tracks is copper. Conductive polymers tend to absorb water and swell, and thus coating conductive polymers with a halo-hydrocarbon polymer layer can prevent water absorption.

Another feature of the coated PCB of the invention is that the z-axis impedance is very low compared to the impedance in the x- and y-axis. By z-axis it is meant the axis pointing into the plane of the PCB. The coating exhibits high impedance in the x- and y-axis, thus demonstrating good insulating properties. However, the impedance is relatively low in the z axis. This enables electrical contact to be made through the coating without having to remove it. This is particularly advantageous for applications such as keypads, switch contacts, test points and the like. This characteristic can be further optimised by controlling the properties of the coating e.g. by controlling the thickness of the layer, its composition and the process conditions in the coating process and the nature of the coating process.

In summary the invention prevents oxidation of, and/or other environmental damage, e.g. modulation of thermal stability, scratch, corrosion and chemical resistance and high barrier effect to the conductive tracks of the blank PCB and provides environmental protection of the assembled PCB usually with one initial step of coating the blank PCB with a halo-hydrocarbon polymer.

The invention also provides a method of protecting a printed circuit board which comprises providing a blank printed circuit board having an environmentally-exposed surface, and which has no solder, or essentially no solder, on said environmentally exposed surface, and applying to that surface to a thickness of a monolayer (usually a few angstroms (Å)) to 10 µm of a composition comprising a halo-hydrocarbon polymer by a thin film deposition technique such as plasma deposition, chemical vapour deposition (CVD), molecular beam epitaxy (MBE), creation of inter-penetrating polymer networks (IPNs), surface absorption of monolayers (SAMs) of polymers of monomers to form in-situ polymers, polymer alloys, or sputtering. Plasma enhanced-chemical vapour deposition (PE-CVD), high pressure/atmospheric plasma deposition, metallo-organic-chemical vapour deposition (MO-CVD) and laser enhanced-chemical vapour deposition (LE-CVD) are alternative deposition techniques. Liquid coating techniques such as liquid dipping, spray coating, spin coating and sol/gel techniques are further alternatives.

The preferred method may depend on the thickness of coating that is required. Liquid coating techniques may be preferred for thicker coatings, while plasma deposition techniques may be preferred for thinner coatings. The thickness of the coating is typically from 1 nm to 2 µm, more typically from 1 nm to 500 nm, still more typically from 3 nm to 500 nm, still more typically from 10 nm to 500 nm, and most typically from 10 nm to 250 nm. The coating is preferably at a thickness of from 10 nm to 100 nm, with 100 nm being a preferred thickness. The halo-hydrocarbon polymer is preferably a fluoro-hydrocarbon polymer, a chloro-hydrocarbon polymer or a fluoro-chloro-hydrocarbon polymer, which may also contain micro-pigments and small quantities of other performance additives (being a common practice in the polymer industry) and may for example be polytetrafluoroethylene (PTFE) type materials. The preferred method of applying the halo-hydrocarbon polymer to the blank PCB is plasma deposition, although all the other techniques mentioned above would also be applicable.

Plasma deposition techniques are extensively used for deposition of coatings in a wide range of industrial applications. The method is an effective way of depositing continuous thin film coatings using a dry and environmentally friendly technique. The PCBs are coated in a vacuum chamber that generates a gas plasma comprising ionised gaseous ions, electrons, atoms and neutral species. In this method, the PCB is introduced into the vacuum chamber that is first pumped down to pressures typically in the range $10^{-3}$ to 10 mbar. A gas is then introduced into the vacuum chamber to generate a stable gas plasma and one or more precursor compounds are then introduced into the plasma as either a gas or liquid to enable the deposition process.

The precursor compounds are typically halogen-containing hydrocarbon materials, which are selected to provide the desired coating properties. When introduced into the gas plasma the precursor compounds are also ionized/decomposed to generate a range of active species that will react at the surface of the PCB, typically by a polymerisation process, to generate a thin halo-hydrocarbon coating. Preferred precursor compounds are perfluoroalkanes, perfluoroalkenes, perfluoroalkynes, fluoroalkanes, fluoroalkenes, fluoroalkynes, fluorochloroalkanes, fluorochloroalkenes, fluorochloroalkynes, or any other fluorinated and/or chlorinated organic material (such as fluorohydrocarbons, fluorocarbons, chlorofluorohydrocarbons and chlorofluorocarbons).

In another aspect of the invention, the coating on the conductive track of the PCB may comprise a very thin layer (for example 5 nm or less) of metal halide (preferably a metal fluoride, such as copper fluoride) directly in contact with the metal surface. In one embodiment, the metal halide layer may be a monolayer or substantially a monolayer, or a few monolayers, or comprise a metal halide zone of layers at the surface. Such a metal halide layer may be very robust and inert, and prevents formation of oxide layers or other tarnishes which prevent effective soldering. The metal halide layer may form when active species in the gas plasma react with the metal surface or may be enhanced using a higher concentration of fluorine species. The halo-hydrocarbon layer may then be deposited in combination with the metal halide layer. The two layers may be discrete, axially or spacially, or alternatively there may be a graded transition from metal halide to halo-hydrocarbon. It is possible that the metal halide layer protects the metal from oxidation, whilst the halo-hydrocarbon layer provides environmental protection from corrosive gases and/or liquids as well as oxidation protection. Furthermore, should the coating eventually be worn away by mechanical abrasion, the underlying metal fluoride layer will prevent oxidation build up, enabling contact to still be made. The nature and composition of the plasma deposited coating depends on a number of conditions: the plasma gas selected; the precursor compound used; the plasma pressure; the coating time; the plasma power; the chamber electrode arrangement; the preparation of the incoming PCB; and the size and geometry of the chamber. Typically the plasma deposition technique can be used to deposit thin films from a monolayer (usually a few angstroms (Å)) to 10 microns (preferably to 5 microns), depending on the above settings and conditions. The plasma technique itself only impacts the uppermost surface of the PCB and is typically fully compatible with the PCB itself, causing no damage or other unwanted effects. An advantage of plasma coating techniques is that the coating deposited accesses all surfaces of the PCB, and thus vertical surfaces such as those only accessible through holes in the PCB and any overhangs will also be covered. If a particular area of the PCB should not be coated with polymer, for example gold contacts at the edge of the PCB, then these areas can be masked during the plasma deposition process.

In a variant of the plasma process, it is possible to use the plasma method for in situ cleaning of the surface of the PCB prior to plasma deposition using an active gas plasma. In this variant, an active gas plasma is used typically in the same chamber for PCB cleaning ahead of introduction of the precursor compound for the plasma deposition stage. The active gas plasma is based on a stable gas, such as hydrogen, oxygen, nitrogen, argon, methane, ethane, other hydrocarbons, tetrafluoromethane ($CF_4$), hexafluoroethane ($C_2F_6$), tetrachloromethane ($CCl_4$), other fluorinated or chlorinated hydrocarbons, other rare gases, or a mixture thereof. In one particular embodiment, the PCB could be cleaned by the same material as to be deposited. For example, a fluorinated or chlorinated hydrocarbon such as tetrafluoromethane ($CF_4$) or hexafluoroethane ($C_2F_6$) or hexafluoropropylene ($C_3F_6$) or octafluoropropane ($C_3F_8$) could be used in the plasma method both to clean the surface of the PCB and lay down a layer of a halo-hydrocarbon polymer and/or a layer of metal fluoride (or chloride).

The invention also provides a method of making a connection to a printed circuit board coated with a composition that comprises a halo-hydrocarbon polymer, which method comprises applying solder and flux to the printed circuit board at a temperature and for a time such that the solder bonds to the metal and the composition is locally dispersed and/or absorbed and/or vaporised and/or dissolved and/or reacted. The action of flux and increased temperature alone will generally interact with the halo-hydrocarbon polymer to remove the coating locally from the area of the PCB to which the flux is applied. The temperature is typically 200° C. to 300° C., preferably 240° C. to 280° C., and most preferably 260° C. In one embodiment, the halo-hydrocarbon polymer may be dissolved and/or absorbed by the flux. We have found that there is often a balance between the temperature required and the acidity or other aggressiveness of the flux. Thus, milder fluxes may suffice if higher temperatures are used, and vice versa. In another embodiment, we can take advantage of the self fluxing action of copper fluoride at the copper surface and any decomposition of the polymer coating to release fluorine and/or HF to initiate fluxing (self fluxing). In the extreme, we have found that in certain cases the invention may dispense with a flux if a sufficiently high temperature is used and so localised heating could be applied. Surprisingly, the composition is generally only removed specifically from the area where solder and/or flux is applied, and therefore the composition remains attached to the surface of the PCB right up until the solder joint. This provides advantageous environmental protection of the conductive tracks of the PCB right up to the solder joint.

The flux used in the invention could be a resin/rosin flux, an organic flux, an inorganic flux, a halide free flux, a no-clean flux, a no-residue flux or a low solids flux. A resin/rosin flux could for example be a synthetic resin or a natural rosin. An organic flux could for example be: an organic acid such as lactic acid or an acrylic acids; an organic salt such as dimethylammonium chloride (DMA HCl); or an organic amine such as urea. An inorganic flux could for example be: an inorganic salt such as zinc chloride, sodium chloride, potassium chloride or sodium fluoride; or an inorganic acid such as hydrochloric acid or nitric acid. An example of a no-clean flux is a rosin flux. Other fluxes used more widely for industrial applications such as general soldering, brazing and welding, or to clean or etch a metal surface (for example borax) could also be used in the present invention. The flux used in this method is typically a mild flux such as a "no-clean" flux that does not require a subsequent step of cleaning the PCB. The flux may optionally be part of a soldering paste. The choice of flux may depend on the nature of the coating, particularly the thickness and composition of the coating. A thicker more resistive coating may require use of a more aggressive flux. A composition comprising the active ingredient or ingredients of flux that remove the halo-hydrocarbon composition from the board could also be used in the present invention in place of flux.

Further, the invention provides a use of a composition comprising a halo-hydrocarbon polymer for environmentally-protecting a printed circuit board to which a solder connection is to be made through the composition, without its prior removal, by dispersal and/or absorption and/or vaporisation of the composition optionally in the presence of a flux.

The environment may contain gaseous agents such as sulphur dioxide, hydrogen sulphide, nitrogen dioxide, hydrogen chloride, chlorine, ozone or water vapour, or liquids such as water, water in which the corrosive gases above are dissolved, salt solutions or other spillages. Such gases are commonly present in highly polluted environments such as cities with atmospheric pollution problems. One particular environmental hazard that the present invention protects PCBs against is atmospheric moisture in which one or more of the corrosive gases listed above is dissolved. We have found that the invention is able to protect PCBs against such harsh environments.

The invention also provides the use of a composition comprising a halo-hydrocarbon polymer for providing long-term storage stability for a blank printed circuit board to which a solder connection is to be made. As mentioned above, the conductive tracks on PCBs tend to oxidise if left exposed to the atmosphere. The oxidation reactions are normally the formation of metal oxides by reaction with atmospheric oxidation, but also include other oxidation reactions, for example where copper metal is oxidised to for example $Cu^+$ or $Cu^{2+}$. The composition of the invention prevents these oxidation reactions so that a blank PCB can be stored for long periods of time, without oxidation of the conductive tracks occurring. Thus, after a long period of storage, good solder connections can be made to the PCB by standard soldering techniques, preferably in the presence of flux, without any pre-cleaning steps.

The invention also provides the use of a composition comprising a halo-hydrocarbon polymer to prevent oxidation and/or corrosion of the conductive tracks of a blank printed circuit board prior to the application of solder to said conductive tracks and/or the formation of a solder connection.

EXAMPLES

Preparation of Coated Printed Circuits Boards

Printed circuit boards that had been etched and cleaned but had not had the surface finish applied were obtained from a manufacturer. These boards were then treated by plasma deposition to generate the halogen-containing coating. The PCB was introduced into the vacuum chamber that was first pumped down to pressures in the range $10^{-3}$ to 10 mbar. A gas was then introduced into the vacuum chamber to generate a stable gas plasma and a halogen-containing precursor hydrocarbon compound was then introduced into the plasma to enable the deposition process. When introduced into the gas plasma the precursor compound also decomposed/ionised to generate a range of active species that reacted at the surface of the PCB to generate a thin halogen-containing coating. A number of experiments were carried out on these treated boards.

Example 1

Figure 1:
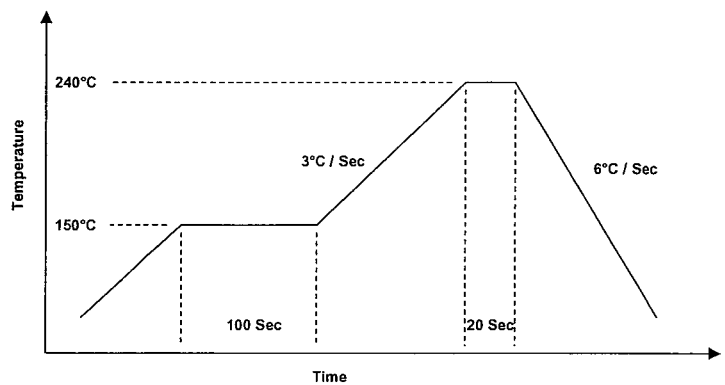
FIG. 1 shows a soldering profile of a reflow oven used with a commercial solder paste containing lead.

A commercial solder paste containing lead was applied by hand dispensing from a syringe onto a number of the component pads on one side of the PCB. Several integrated circuits were placed onto the pads that had solder paste on them. The PCB was then put into a reflow oven where the soldering profile had been set up as shown in FIG. 1. Subsequently, the joints were examined visually using a microscope, where they were found to have good wetting characteristics. Some of the joints were then pulled apart by prising the component up with a tool. In each case the leg of the integrated circuit pulled out of the solder, leaving the joint to the PCB pad intact.

Example 2

Figure 2:
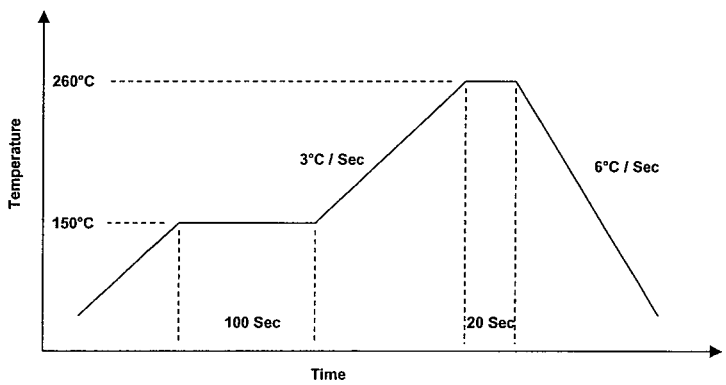
FIG. 2 shows a soldering profile of a reflow oven used with a lead-free commercial solder paste.
Figure 3:
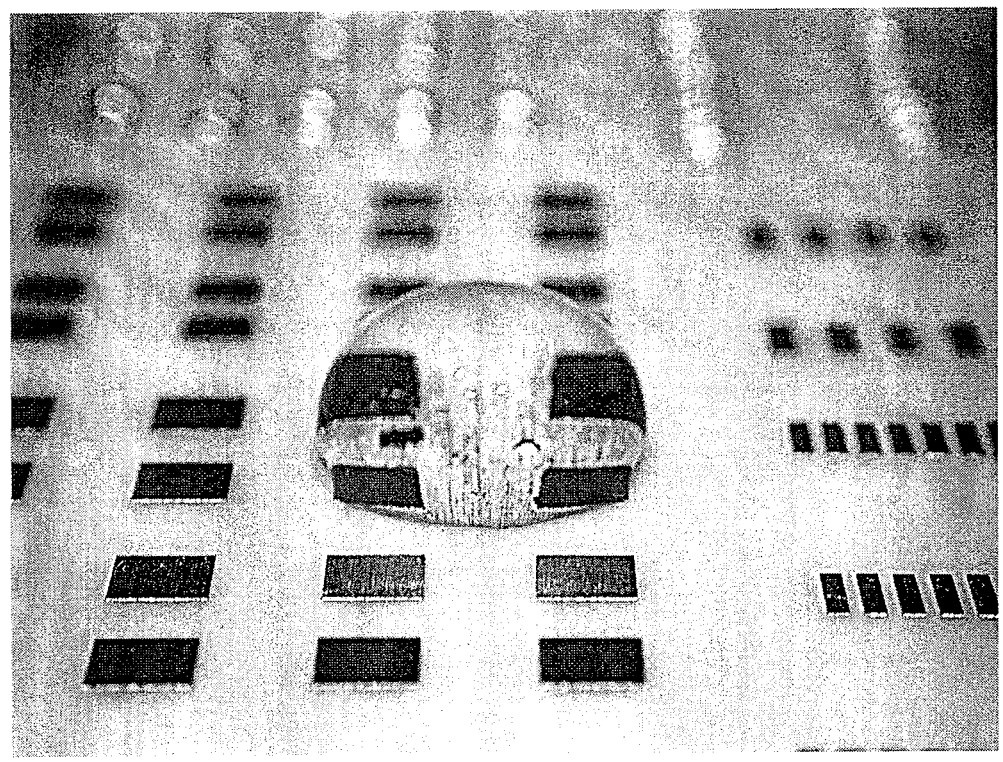
FIG. 3 is an image of a coated PCB of the invention with a water droplet on the surface, demonstrating the low surface energy, low wettability, liquid impermeable nature of the surface coating.
Figure 4:
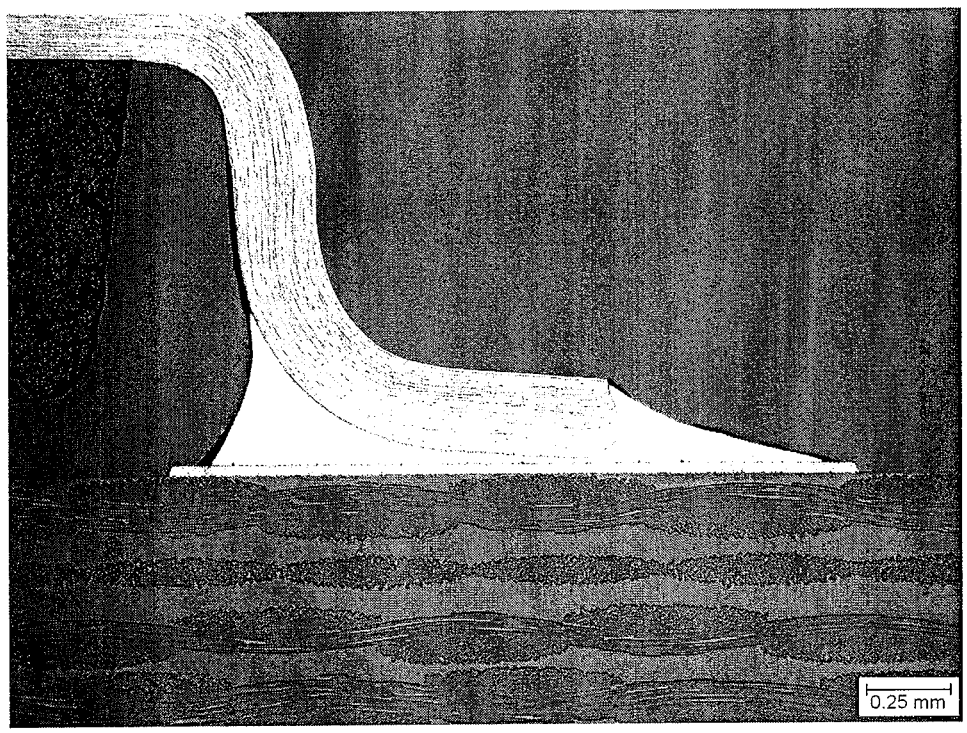
FIG. 4 is a cross-section image of strong solder joint made by soldering through the coating on a PCB of the invention.
Figure 5:
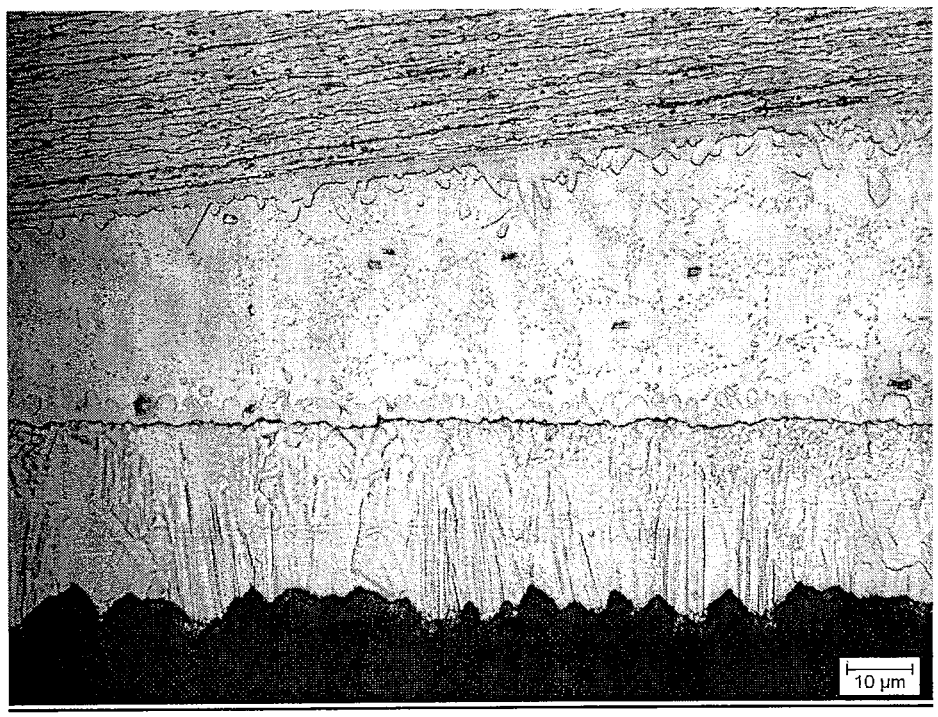
FIG. 5 is a cross-section image of strong solder joint formed on a PCB of the invention, demonstrating the formation of good quality copper-tin intermetallics on the upper side of lower copper surface.
Figure 6:
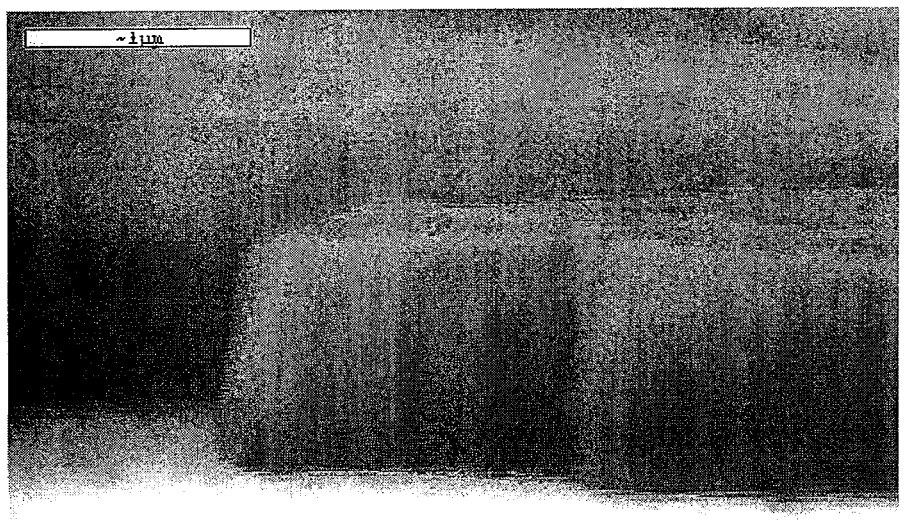
FIG. 6 is an SEM (Scanning Electron Microscopy) image of the edge of a 1 μm thick coating polymer on a PCB of the invention, shown at ×30,000 magnification.
Figure 7:
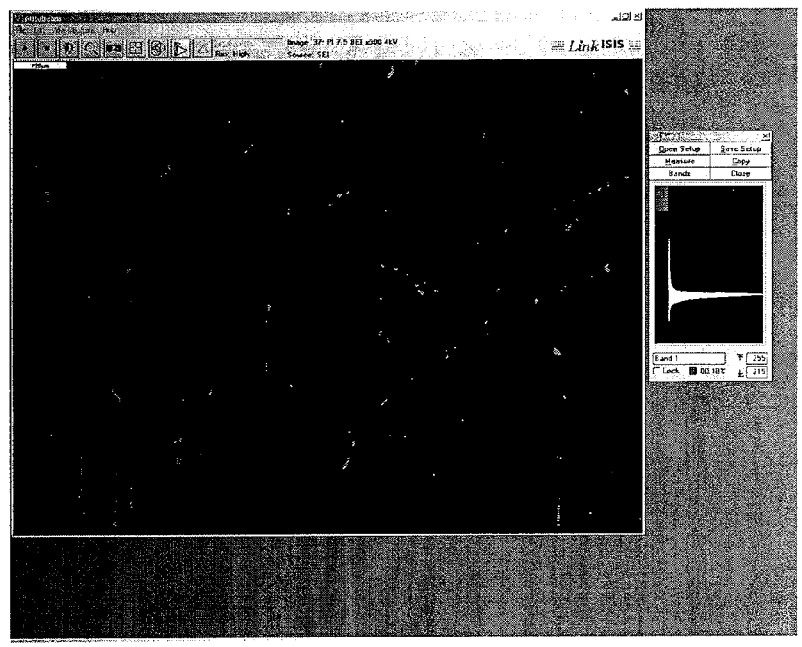
FIG. 7 is a BEI Image (Back Scattering Electron Image) showing an example area of coated PCB of the invention, demonstrating coating continuity in excess of 99.8% coverage.
Figure 8:
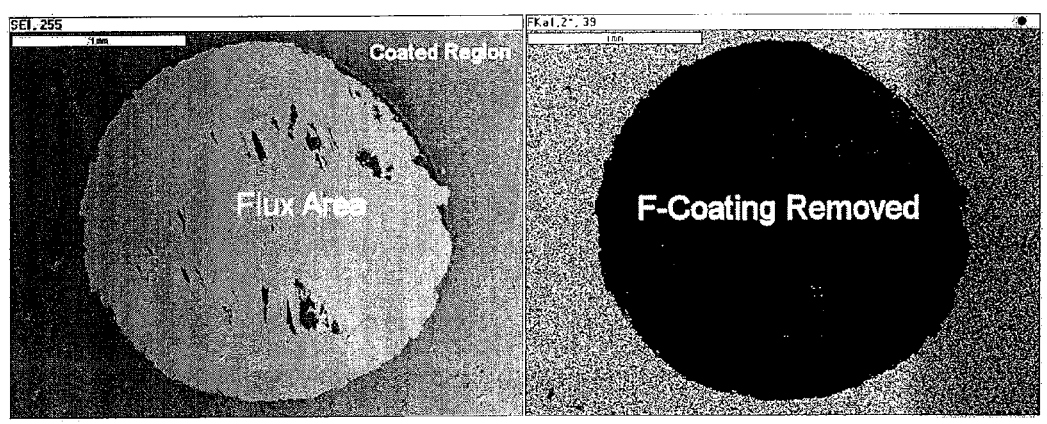
FIG. 8 is a SEM/EDX image showing a region of coating removed selectively from a PCB of the invention by the action of flux at a temperature, for a nominal 1 micron thick coating. The image on the left shows where flux has been selectively applied. The image on the right shows that the coating has selectively been removed in the area to which flux was applied.
Figure 9:
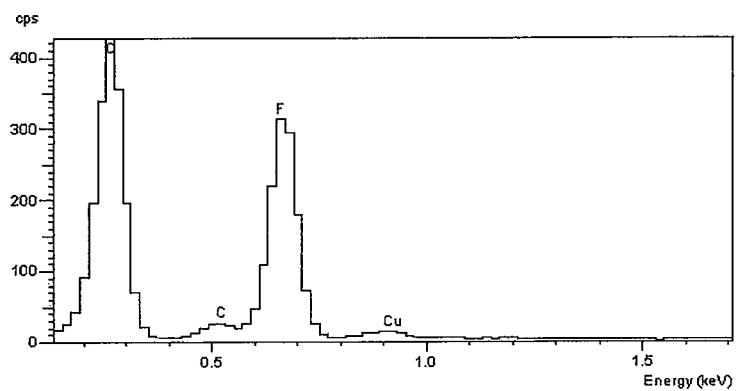
FIG. 9 is an EDX spectrum showing the carbon/fluorine composition of the coating on the copper of a PCB of the invention.
Figure 10:
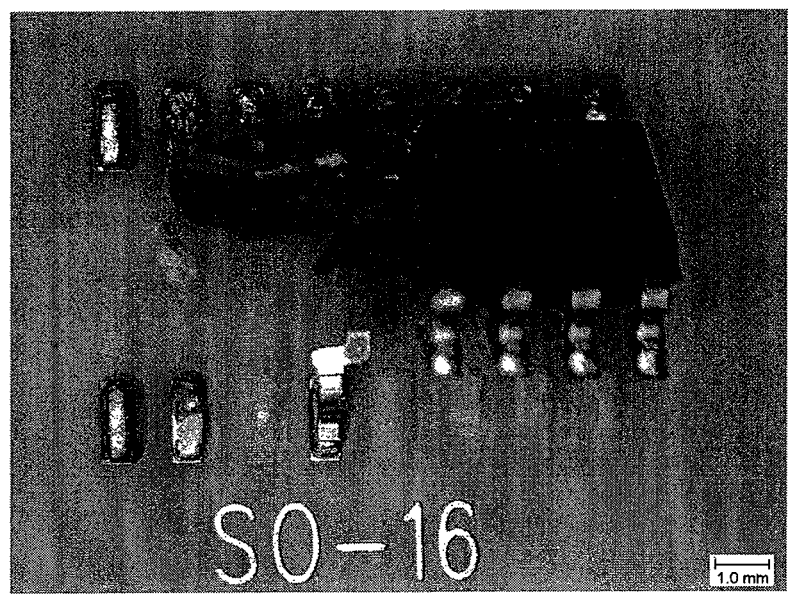
FIG. 10 is an image of IC component legs ripped from a soldered PCB of the invention, demonstrating strong solder joints. Under severe testing the joints finally fail by fracture of the copper pad to board substrate bond, rather than at the solder joint.
Figure 11:
FIG. 11 is an image of soldered pads ripped from soldered PCB of the invention, demonstrating strong solder joints. Under severe testing the joints finally fail by fracture of the copper pad to board substrate bond, rather than at the solder joint.
Figure 12:
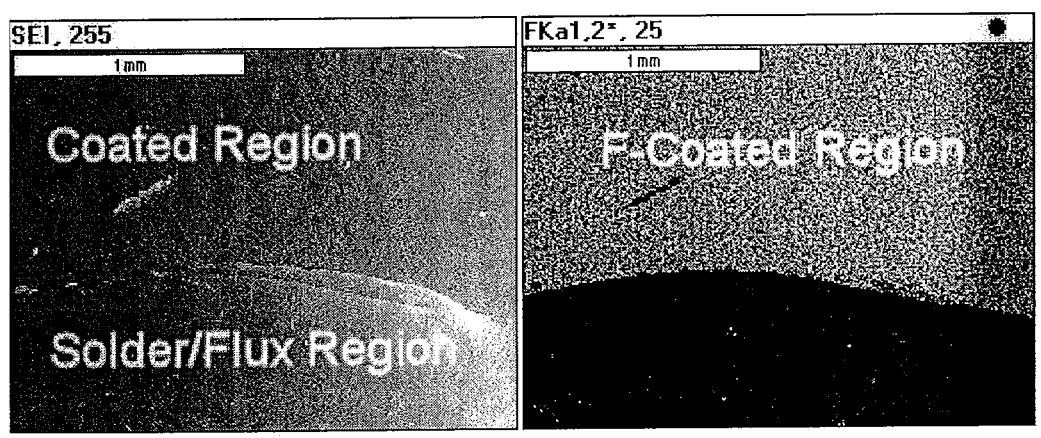
FIG. 12 is an SEM image and an EDX image showing the presence of polymer coating right up to a solder joint edge formed on a PCB of the invention.
Figure 13:
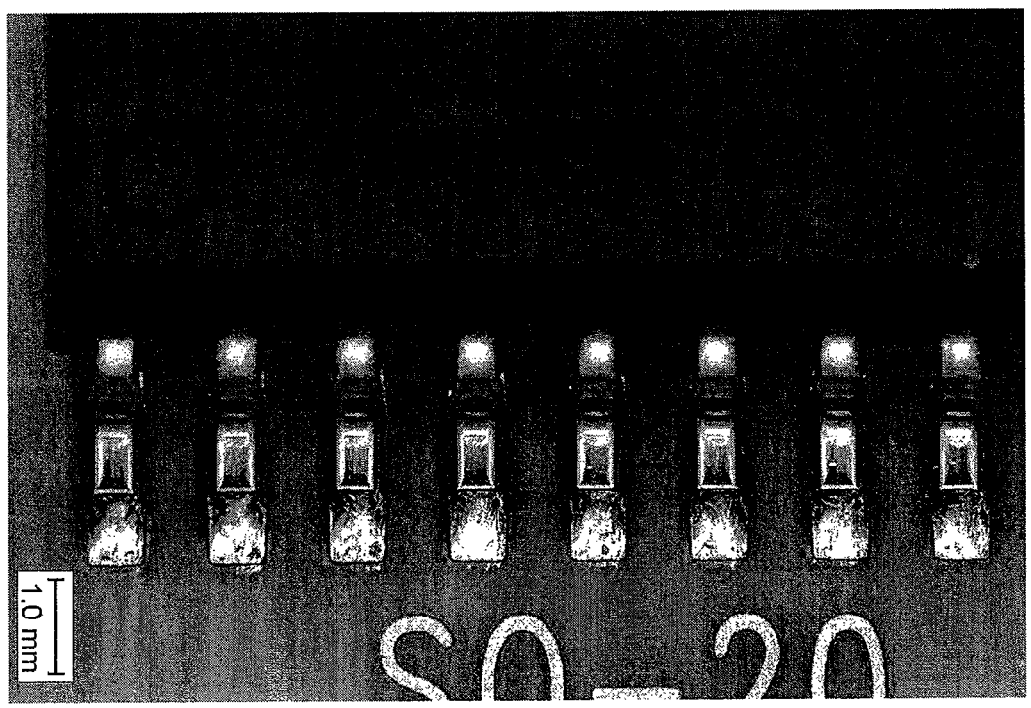
FIG. 13 is an optical microscopy image showing a series of good quality solder joints formed on a PCB of the invention.
Figure 14A:
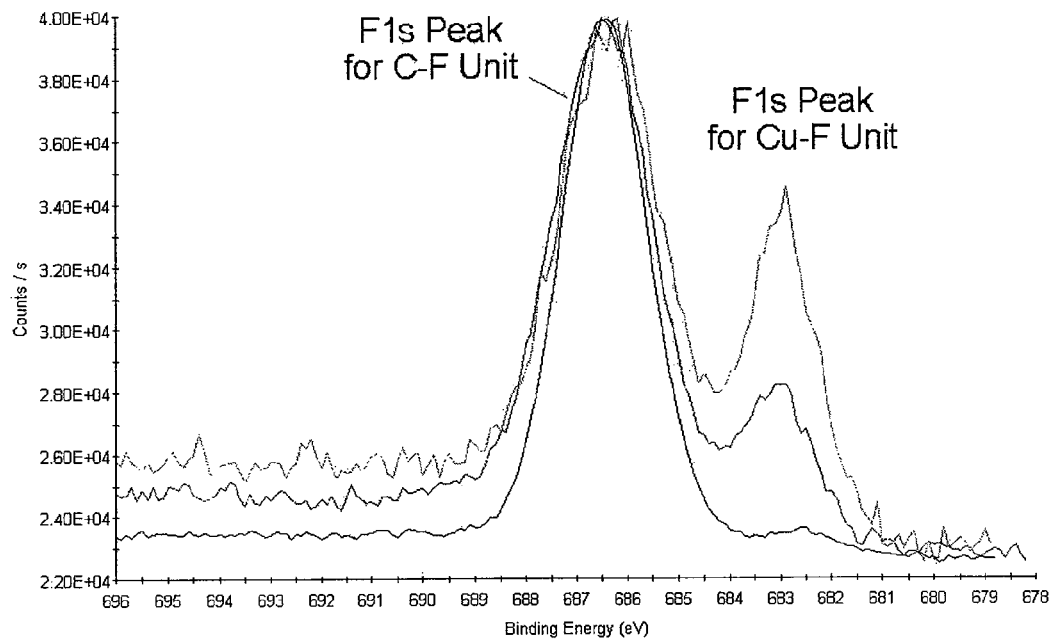
FIG. 14a is an XPS spectrum of a set of thin coatings of the invention showing various contributions from C—F and Cu—F materials.
Figure 14B:
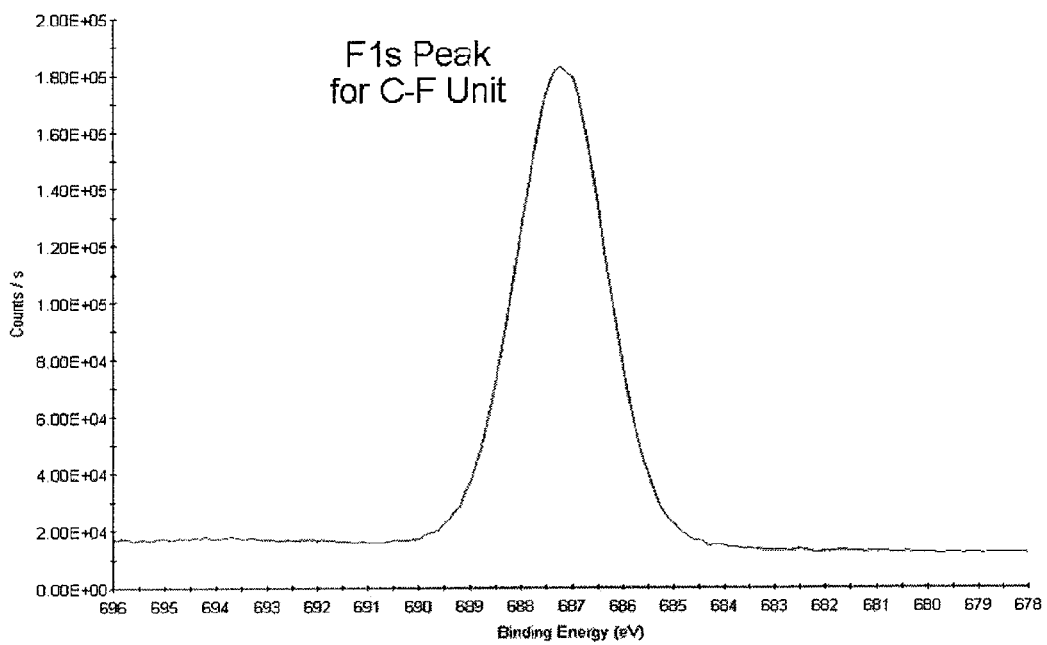
FIG. 14b is an XPS spectrum showing C—F containing material for a thick coating.

The above tests were repeated using lead-free solder paste with a modified reflow profile as shown in FIG. 2, with similar results.

Example 3

Flux only was applied to regions of two PCB's and they were heated up to 260 C for ten seconds and five minutes. Examination showed that the coating was no longer present in the areas where flux had been applied on either of the PCBs. The coating however remained intact in the areas where flux had not been applied.

Example 4

Shear Strength Test

Eight assemblies with four PCB finishes were prepared for shear testing. There were two assemblies for each PCB finish. Each assembly had seven 1206 chip resistors and four 0805 chip capacitors assembled. Fourteen 1206 resistors and eight 0805 capacitors from each assembly finish were shear tested to determine the Ultimate Shear Strength (USS) of the solder joints for each finish assembly.

Test Conditions

The board was mounted in a shear tester. The stand-off height of the chisel tool above the PCB surface was 80 μm, and the width of chisel tool is 2 mm. During each test, the shear tool was moved forward at a defined speed of 100 μm/s against the test component, and the force was monitored until the solder joint attachment broke. The shear tester used is the Dage Series 4000, with a DS100 testing head.

Results of Initial Shear Strength Tests

| OSP | ENIG | PTFE |
|---|---|---|
| 72.03 | 69.47 | 73.14 |
| 71.29 | 72.88 | 63.20 |
| 68.72 | 68.35 | 75.49 |
| 68.10 | 70.21 | 77.28 |
| 67.70 | 67.89 | 77.08 |
| 79.03 | 68.59 | 69.99 |
| 73.21 | 74.22 | 67.46 |
| 74.35 | 72.32 | 72.31 |
| 79.57 | 68.95 | 70.50 |
| 66.34 | 66.05 | 65.95 |
| 78.15 | 82.6 | 61.80 |
| 70.62 | 79.43 | 61.52 |
| 72.07 | 76.98 | 71.09 |
| 68.16 | 70.31 | 71.15 |
| 72.10 ± 4.34 | 72.01 ± 4.78 | 69.85 ± 5.25 |

Example 5

The table of PCB surface energies below shows increased hydrophobicity with coating process time:

| | Coating Process Time (min) | | | | | | | | |
|---|---|---|---|---|---|---|---|---|---|
| | 0 | 1 | 5 | 7.5 | 10 | 15 | 20 | 30 | 50 |
| Surface Energy (mN/m) | 50 | 46 | <26 | <26 | <26 | <26 | <26 | <26 | <26 |

Note
The Limit of Detection of the Surface Energy Measurement Method ca. 26 mN/m.

The invention claimed is:

1. A printed circuit board, comprising:
a substrate comprising an insulating material;
a plurality of conductive tracks attached to at least one surface of the substrate;
a coating deposited on the at least one surface of the substrate, the coating covering at least a portion of the plurality of conductive tracks, the coating comprising at least one halo-hydrocarbon polymer;
at least one electrical component connected by a solder joint to at least one conductive track, wherein the solder joint is soldered through the coating in a soldering process such that the solder joint abuts the coating; and
wherein:
the solder joint is formed on a particular region of the substrate after a substantially continuous layer of the coating is deposited on the substrate; and
the soldering process removes the coating from the particular region of the substrate without removing the coating from other regions of the substrate.

2. The printed circuit board of claim 1, wherein the coating has a thickness from 1 nanometer to 10 micrometers.

3. The printed circuit board of claim 1, wherein the coating has a thickness from 10 nanometers to 100 nanometers.

4. The printed circuit board of claim 1, wherein the coating is deposited prior to formation of the solder joint such that there is essentially no solder between the coating and the plurality of conductive tracks.

5. The printed circuit board of claim 1, wherein the at least one halo-hydrocarbon polymer comprises one or more fluoro-hydrocarbons.

6. The printed circuit board of claim 1, wherein less than five percent of the total number of atoms in the at least one halo-hydrocarbon polymer are heteroatoms.

7. The printed circuit board of claim 6, wherein:
the at least one halo-hydrocarbon polymer has a straight or branched chain structure;
the at least one halo-hydrocarbon polymer comprises at least one heteroatom; and
the at least one heteroatom comprises at least one of:
nitrogen;
sulfur; and
oxygen.

8. The printed circuit board of claim 1, wherein the coating comprises:
a first layer comprising a metal halide; and
a second layer comprising at least one halo-hydrocarbon polymer.

9. The printed circuit board of claim 8, wherein the first layer comprising a metal halide allows self fluxing during soldering of the at least one electrical component.

10. The printed circuit board of claim 1, wherein the coating comprises:
a first layer comprising a metal halide, the first layer protecting the plurality of conductive tracks from oxidation; and
a second layer comprising one or more halo-hydrocarbon polymers, the second layer protecting the plurality of conductive tracks from corrosion.

11. The printed circuit board of claim 1, wherein the coating comprises:
a first layer comprising a metal fluoride, the first layer in direct contact with the plurality of conductive tracks, the first layer having a thickness from 3 angstroms to 5 nanometers; and
a second layer comprising one or more halo-hydrocarbon polymers, the second layer in direct contact with the first layer, the second layer having a thickness from 1 nanometer to 10 micrometers.

12. The printed circuit board of claim 1, wherein the coating has a variable thickness such that a portion of the coating on a first region of the substrate has a different thickness than another portion of the coating on a second region of the substrate, wherein the first region of the substrate comprises a region that is distinct from the second region of the substrate.

13. The printed circuit board of claim 1, wherein:
the plurality of conductive tracks are copper tracks; and
the at least one halo-hydrocarbon polymer comprises a PTFE type material.

14. The printed circuit board of claim 1, wherein the coating is deposited by plasma deposition using one or more precursor compounds comprising at least one of:
a perfluoroalkane;
a perfluoroalkene;
a perfluoroalkyne;
a fluoroalkane;
a fluoroalkene;
a fluoroalkyne;
a fluorochloroalkane;
a fluorochloroalkene; and
a fluorochloroalkyne.

15. The printed circuit board of claim 14, wherein the one or more precursor compounds have a straight chain or branched chain structure.

16. The printed circuit board of claim 1, wherein the soldering process comprises heating a flux at the particular region of the substrate and the flux dissolves the coating from the particular region without dissolving the coating from other regions of the substrate.

17. The printed circuit board of claim 1, wherein the soldering process comprises heating a flux at the particular region of the substrate and the flux removes the coating from the particular region without the coating from other regions of the substrate.

18. The printed circuit board of claim 1, further comprising a particular electrical component that is wire bonded through the coating to at least one conductive track.

19. The printed circuit board of 18, wherein:
the particular electrical component is wire bonded through the coating to the at least one conductive track by a wire coated with the coating; and
the wire bond is formed without first removing the coating from the wire.

20. The printed circuit board of claim 1, wherein the electrical impedance through the coating along an axis perpendicular to the at least one surface of the substrate is lower than the electrical impedance through the coating along an axis parallel to the at least one surface of the substrate.

21. The printed circuit board of claim 1, further comprising a conductive region between the substrate and the coating, wherein the conductive region comprises at least of portion of the plurality of conductive tracks and the conductive region is operable to make electrical contact through the coating to an electrical component without removing the coating from the conductive region.

22. A printed circuit board, comprising:
a substrate comprising an insulating material;
a plurality of conductive tracks attached to at least one surface of the substrate; and
a coating deposited on the plurality of conductive tracks such that there is essentially no solder between the coating and the plurality of conductive tracks, the coating comprising at least one halo-hydrocarbon polymer that allows a connection to be soldered through the coating in a soldering process to at least one conductive track to form a solder joint without first removing the coating from the at least one conductive track; and
wherein:
the solder joint is formed on a particular region of the substrate after a substantially continuous layer of the coating is deposited on the substrate; and
the soldering process removes the coating from the particular region of the substrate without removing the coating from other regions of the substrate.

23. The printed circuit board of claim 22, wherein the coating has a thickness from 1 nanometer to 10 micrometers.

24. The printed circuit board of claim 22, wherein the coating has a thickness from 10 nanometers to 100 nanometers.

25. The printed circuit board of claim 22, wherein the at least one halo-hydrocarbon polymer comprises one or more fluoro-hydrocarbons.

26. The printed circuit board of claim 22, wherein less than five percent of the total number of atoms in the at least one halo-hydrocarbon polymer are heteroatoms.

27. The printed circuit board of claim 22, wherein the coating comprises:
a first layer comprising a metal halide, the first layer protecting the plurality of conductive tracks from oxidation; and
a second layer comprising one or more halo-hydrocarbon polymers.

28. The printed circuit board of claim 27, wherein the first layer comprising the metal halide allows self fluxing during soldering of the connection to said plurality of conductive track.

29. The printed circuit board of claim 22, wherein the coating has a variable thickness such that a portion of the coating on a first region of the substrate has a different thickness than another portion of the coating on a second region of the substrate, wherein the first region of the substrate comprises a region that is distinct from the second region of the substrate.

30. The printed circuit board of claim 22, wherein:
the plurality of conductive tracks are copper tracks; and
the at least one halo-hydrocarbon polymer comprises a PTFE type material.

31. The printed circuit board of claim 22, wherein the soldering process comprises heating a flux at the particular region of the substrate and the flux dissolves the coating from the particular region without dissolving the coating from other regions of the substrate.

32. The printed circuit board of claim 22, wherein the soldering process comprises heating a flux at the particular region of the substrate and the flux removes the coating from the particular region without removing the coating from other regions of the substrate.

33. The printed circuit board of claim 22, wherein the electrical impedance through the coating along an axis perpendicular to the at least one surface of the substrate is lower than the electrical impedance through the coating along an axis parallel to the at least one surface of the substrate.

34. The printed circuit board of claim 22, further comprising an electrical component that is wire bonded through the coating to at least one conductive track.

35. An apparatus, comprising:
- a substrate;
- a coating deposited on at least one surface of the substrate, the coating comprising at least one halo-hydrocarbon polymer;
- at least one metal contact between the substrate and the coating; and
- at least one electrical component connected by a solder joint to the at least one metal contact, wherein the solder joint is soldered through the coating in a soldering process such that the solder joint abuts the coating; and wherein:
- the solder joint is formed on a particular region of the substrate after a substantially continuous layer of the coating is deposited on the substrate; and
- the soldering process removes the coating from the particular region of the substrate without removing the coating from other regions of the substrate.

* * * * *